(12) United States Patent
Nedovic

(10) Patent No.: US 7,688,122 B2
(45) Date of Patent: Mar. 30, 2010

(54) CHARGE PUMP WITH CASCODE BIASING

(75) Inventor: Nikola Nedovic, San Jose, CA (US)

(73) Assignee: Fujitsu Limited, Kawasaki (JP)

( * ) Notice: Subject to any disclaimer, the term of this patent is extended or adjusted under 35 U.S.C. 154(b) by 124 days.

(21) Appl. No.: 11/970,288

(22) Filed: Jan. 7, 2008

(65) Prior Publication Data

US 2008/0191787 A1    Aug. 14, 2008

Related U.S. Application Data

(60) Provisional application No. 60/889,034, filed on Feb. 9, 2007.

(51) Int. Cl.
*H03L 7/06* (2006.01)
(52) U.S. Cl. .............. 327/157; 327/148; 331/8; 331/17
(58) Field of Classification Search .............. 327/148, 327/157; 331/8, 17
See application file for complete search history.

(56) References Cited

U.S. PATENT DOCUMENTS

| | | | |
|---|---|---|---|
| 5,473,283 A | 12/1995 | Luich | 331/8 |
| 5,508,660 A | 4/1996 | Gersbach et al. | 331/17 |
| 6,160,432 A * | 12/2000 | Rhee et al. | 327/157 |
| 6,181,210 B1 | 1/2001 | Wakayama | 331/8 |
| 6,586,976 B2 * | 7/2003 | Yang | 327/157 |
| 6,774,730 B2 | 8/2004 | Gasparik | 331/17 |
| 7,161,401 B2 | 1/2007 | Li | 327/157 |
| 7,514,985 B2 * | 4/2009 | Chang | 327/536 |
| 2003/0038661 A1 * | 2/2003 | Chokkalingam et al. | 327/157 |
| 2007/0272923 A1 * | 11/2007 | Lee | 257/48 |

OTHER PUBLICATIONS

T.J. Gardner, "Phaselock Techniques", 3rd edition, John Wiley, New York, 2005.
A. Maxim, "A 0.16-2.55-GHz CMOS Active Clock Deskewing PLL Using Analog Phase Interpolation", IEEE Journal of Solid-State Circuits, vol. 40, No. 1, p. 110-131, Jan. 2005.

(Continued)

*Primary Examiner*—Lincoln Donovan
*Assistant Examiner*—Patrick O'Neill
(74) *Attorney, Agent, or Firm*—Baker Botts L.L.P.

(57) ABSTRACT

In particular embodiments, a charge pump includes a first input transistor operable to receive an up signal and in response to receiving the UP signal, transmit a corresponding output current from a positive power supply to an output node. The charge pump further includes a second input transistor operable to receive a down signal and in response to receiving the DN signal, transmit a second corresponding output current from a negative power supply to the output node. Additionally, the charge pump includes a first cascode transistor and a second cascode transistor positioned in a first current path between the first input transistor and the output node, and a third cascode transistor and a fourth cascode transistor positioned in a second current path between the second input transistor and the output node. The charge pump further includes a current mirror coupled to gates of the first, second, third, and fourth cascode transistors.

19 Claims, 1 Drawing Sheet

OTHER PUBLICATIONS

A. Maxim et al., "A Low Jitter 125-1250 MHz Process-Independent and Ripple-Poleless 0.18-μm CMOS PLL Based on a Sample-Reset Loop Filter", IEEE Journal of Solid-State Circuits, vol. 36, No. 11, p. 1673-1683, Nov. 2001.

A. Ong et al., "A 40-43-Gb/s clock and data recovery IC with integrated SFI-5 1:16 demultiplexer in SiGe technology", IEEE Journal of Solid-State Circuits, vol. 38, No. 12, p. 2155-2168, Dec. 2003.

J. Cranickx and M.S.J. Steyaert, "A Fully Integrated CMOS DCS-1800 Frequency Synthesizer", IEEE Journal of Solid-State Circuits, vol. 33, No. 11, p. 2054-2065, Dec. 1998.

J.F. Parker and D. Ray, "A 1.6-GHz CMOS PLL with On-Chip Loop Filter", IEEE Journal of Solid-State Circuits, vol. 33, No. 3, p. 337-343, Mar. 1998.

A.L. Coban et al., "A 2.5-3.125-Gb/s Quad Transceiver With Second-Order Analog DLL-Based CDRs" IEEE Journal of Solid-State Circuits, vol. 40, No. 9, p. 1940-1947, Sep. 2005.

A.L.S. Loke et al., "A Versatile 90-nm CMOS Charge-Pump PLL for SerDes Transmitter Clocking", IEEE Journal of Solid-State Circuits, vol. 41, No. 8, p. 1894-1908, Aug. 2006.

U. Cilingiroglu et al., "An Evaluation of MOS Interface-Trap Charge Pump as an Ultralow Constant-Current Generator", IEEE Journal of Solid-State Circuits, vol. 38, No. 1, p. 71-83, Jan. 2003.

P.R. Gray, P.J. Hurst, S.H. Lewis, and R.G. Meyer, "Analysis and Design of Analog Integrated Circuits", 4th edition, John Wiley, 2001.

\* cited by examiner

CHARGE PUMP WITH CASCODE BIASING

CROSS REFERENCE TO RELATED APPLICATIONS

This application claims the benefit under 35 U.S.C. §119(e) of U.S. Provisional Application No. 60/889,034, entitled "Charge Pump with Cascade Biasing Achieving Wide Output Range," filed Feb. 9, 2007.

TECHNICAL FIELD

The present disclosure relates generally to signal processing, and more particularly to a charge pump with cascode biasing.

BACKGROUND

A Phase Locked Loop ("PLL") circuit is an electronic control system that may be used, in part or in whole, to generate or maintain one signal that is locked onto the phase and frequency of another signal. As an example, a PLL may be used as a clock data recovery ("CDR") circuit to synchronize a clock signal with an input data signal. While particular embodiments of a PLL may vary with respect to their component parts, an example PLL may include a frequency/phase detector, a charge pump, a loop filter, and a variable-frequency signal generator (e.g., a voltage controlled oscillator ("VCO")). In an example situation, a PLL may receive a reference signal from an outside source (e.g., an input signal from a remote data source) and may compare the phase of the reference signal with a locally-generated variable-frequency signal. The locally-generated variable-frequency signal may originate, for example, from a variable-frequency signal generator over which the PLL has control. As part of its comparison, the phase detector may determine a phase difference between the reference signal and the locally-generated variable-frequency signal and may use the phase difference to generate an error correction signal. In particular instances, the error correction signal may be input into a charge pump that constitutes part of the PLL. The charge pump may generate a current in response to the error correction signal. In turn, the current generated by the charge pump may be taken to a loop filter and may dictate the output voltage of the loop filter. The output voltage from the loop filter is fed back to the variable-frequency signal generator to control the frequency of the signal generated by the signal generator. By controlling the frequency of the signal generator using the charge pump output, the PLL may adjust the frequency of the signal generator to match the frequency of the reference signal.

Because the frequency of the variable-frequency signal generator may ultimately depend on the current generated by the charge pump, the "linear range of operation" of the charge pump is one metric used to gauge the effectiveness of charge pumps. The liner range of operation may be referred to as the range of voltages for which the charge pump can output a constant current (e.g., for which a specified output resistance holds).

DESCRIPTION OF EXAMPLE EMBODIMENTS

Overview

In particular embodiments, a charge pump having a wide range of linear operation may be attained by including a current mirror and a number of cascode transistors in the charge pump and using the current mirror to bias the cascode transistors so that the cascode transistors operate in the saturation regime. More specifically, in particular embodiments, such a charge pump includes a first input transistor operable to receive an up ("UP") signal and in response to receiving the UP signal, transmit a corresponding output current from a positive power supply to an output node. The charge pump further includes a second input transistor operable to receive a down ("DN") signal and in response to receiving the DN signal, transmit a corresponding output current from a negative power supply to the output node. Additionally, the charge pump includes a first cascode transistor and a second cascode transistor positioned in a first current path between the first input transistor and the output node, and a third cascode transistor and a fourth cascode transistor positioned in a second current path between the second input transistor and the output node. The charge pump further includes a current mirror coupled to gates of the first, second, third, and fourth cascode transistors. The current mirror is operable to respectively transmit a first bias voltage ($V_1$), a second bias voltage ($V_2$), a third bias voltage ($V_3$), and a fourth bias voltage ($V_4$) to the gates of the first, second, third, and fourth cascode transistors.

In particular embodiments, the current mirror comprises a plurality of p-type metal-oxide-semiconductor (pMOS) field-effect transistors and a plurality of n-type metal-oxide-semiconductor (nMOS) field-effect transistors, and each pMOS or nMOS transistor includes a channel-width. The respective channel-widths of the pMOS and nMOS transistors determine values of the bias voltages $V_1$-$V_4$ and the bias voltages $V_1$-$V_4$ respectively enable the first, second, third, and fourth cascode transistors to operate in a saturation regime. By employing a cascode structure to increase the output resistance of the charge pump, and by using a current mirror to provide bias voltages to the cascode transistors that enable the cascode transistors to operate in saturation regime over the maximum swing of the output voltage of the charge pump, technical advantages such as a large output resistance, a wide output voltage swing, and a low systematic gain error may be realized. In turn, such technical advantages may enable the charge pump to operate with a relatively small charge pump current and a low supply voltage.

It will be understood that the various embodiments of the present disclosure may include some, all, or none of the enumerated technical advantages. In addition other technical advantages of the present disclosure may be readily apparent to one skilled in the art from the figures, description, and claims included herein.

Description

Figure 1:
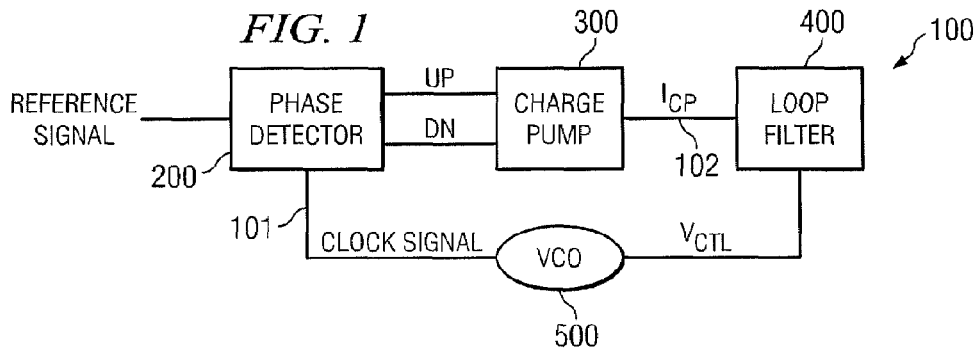
FIG. 1 illustrates an example PLL according to an example embodiment of the present disclosure.

FIG. 1 illustrates an example system 100 for phase or frequency locking that includes a phase detector 200 for detecting the phase difference between two signals, a charge pump 300 for receiving an error correction signal from phase detector 200 and outputting a corresponding current ($I_{CP}$), a loop filter 400 controlling the dynamic behavior of a feedback loop 101 and for filtering out any high frequency noise associated with the current output from charge pump 300, a voltage controlled oscillator (VCO) 500 for producing a variable-frequency clock signal in response to the voltage output of loop filter 400, and a feedback loop 101 that couples these components together. In particular embodiments, system 100 may receive a reference signal (e.g., an input data signal) and produce a clock signal that matches the frequency of the reference signal as is described in further detail below.

As noted above, phase detector 200 compares the phase of a reference signal to the phase of a clock signal. As an example and not by way of limitation, phase detector 200 may include a XOR gate, a four-quadrant multiplier, or a phase frequency detector (PFD). In particular embodiments, phase detector 200 may use the phase difference between the reference signal and the clock signal to generate a corresponding error correction signal. The error correction signal may comprise an up signal ("UP") and a down signal ("DN") active at opposite logic or complimentary levels. In particular embodiments, one or more characteristics of the error correction signal may be proportional to the phase difference between the reference signal and the clock signal. As an example and not by way of limitation, if the phase of the clock signal severely lags behind the phase of the reference signal, phase detector 200 may output a relatively wide UP signal (e.g. a wide positive signal). As another example and not by way of limitation, if the phase of the clock signal slightly leads the phase of the reference signal, phase detector 200 may output a relatively narrow DN signal (e.g. a narrow negative signal).

Phase detector 200 transmits the error correction signal to charge pump 300. In response to receiving the error correction signal, charge pump 300 generates a current, $I_{CP}$. In particular embodiments, the difference between the pulse-widths of the UP signals and DN signals may be proportionally related to the average current output of charge pump 300. As an example and not by way of limitation, a wide UP pulse may result in a proportionally large increase in the amount of positive current being supplied to loop filter 400 by charge pump 300 while a narrow DN pulse may result in a proportionally small amount of negative current being supplied to loop filter 400 by charge pump 300.

The current output from charge pump 300 determines the output voltage ($V_{CTL}$) of loop filter 400. In particular embodiments, loop filter 400 may filter out high frequency variations associated with the current output from charge pump 300 (e.g., noise, high frequency input jitter, etc.), thereby allowing $I_{CP}$ to smoothly track phase changes in the reference signal without disturbance by high frequency (or other undesirable) interferences. Additionally, the output resistance of charge pump 300 may affect the transfer function of loop filter 400. Consequently, it may be desirable for charge pump 300 to have a high output resistance.

The output voltage of loop filter 400 (e.g., $V_{CTL}$) is transmitted to VCO 500. VCO 500 generates a clock signal based on $V_{CTL}$. In particular embodiments, $V_{CTL}$ may control the frequency of the clock signal generated by VCO 500. As an example and not by way of limitation, a large pulse of positive current (e.g., positive $I_{CP}$) from charge pump 300 may result in a proportionally large increase in $V_{CTL}$ at loop filter 400. In turn, the increase in $V_{CTL}$ will increase the frequency of the clock signal from VCO 500. As another example and not by way of limitation, a small pulse of negative current (e.g., negative $I_{CP}$) from charge pump 300 may result in a corresponding change in $V_{CTL}$ which will decrease the frequency of the clock signal from VCO 500.

Since the current output of charge pump 300 may directly affect the frequency of VCO 500 (as discussed above), a linear range of operation of charge pump 300 across a wide range of voltages may be desirable to ensure predictable behavior of VCO 500 across a broad range of frequencies. One of ordinary skill in the art will appreciate that the relationship between the error correction signal and the current output of charge pump 300 was presented for the sake of explanatory simplicity and will further appreciate that the present disclosure contemplates the use of any suitable error correction signal scheme to control the current output of charge pump 300.

In particular embodiments, the clock signal from VCO 500 is fed back into phase detector 200 and is synchronized with the reference signal using the process described above. One of ordinary skill in the art will appreciate that the above-described implementation of system 100 as described with respect to a clock signal and a reference data signal was presented for the sake of explanatory simplicity and will further appreciate that the present disclosure contemplates the use of system 100 to synchronize any suitable signal or signals. One of ordinary skill in the art will further appreciate that the above-described components and topology of system 100 were presented for the sake of explanatory simplicity and that the present disclosure contemplates any suitable topology of any suitable components to maintain the frequency and phase of one signal in specific relationship with that of another signal.

Figure 2:
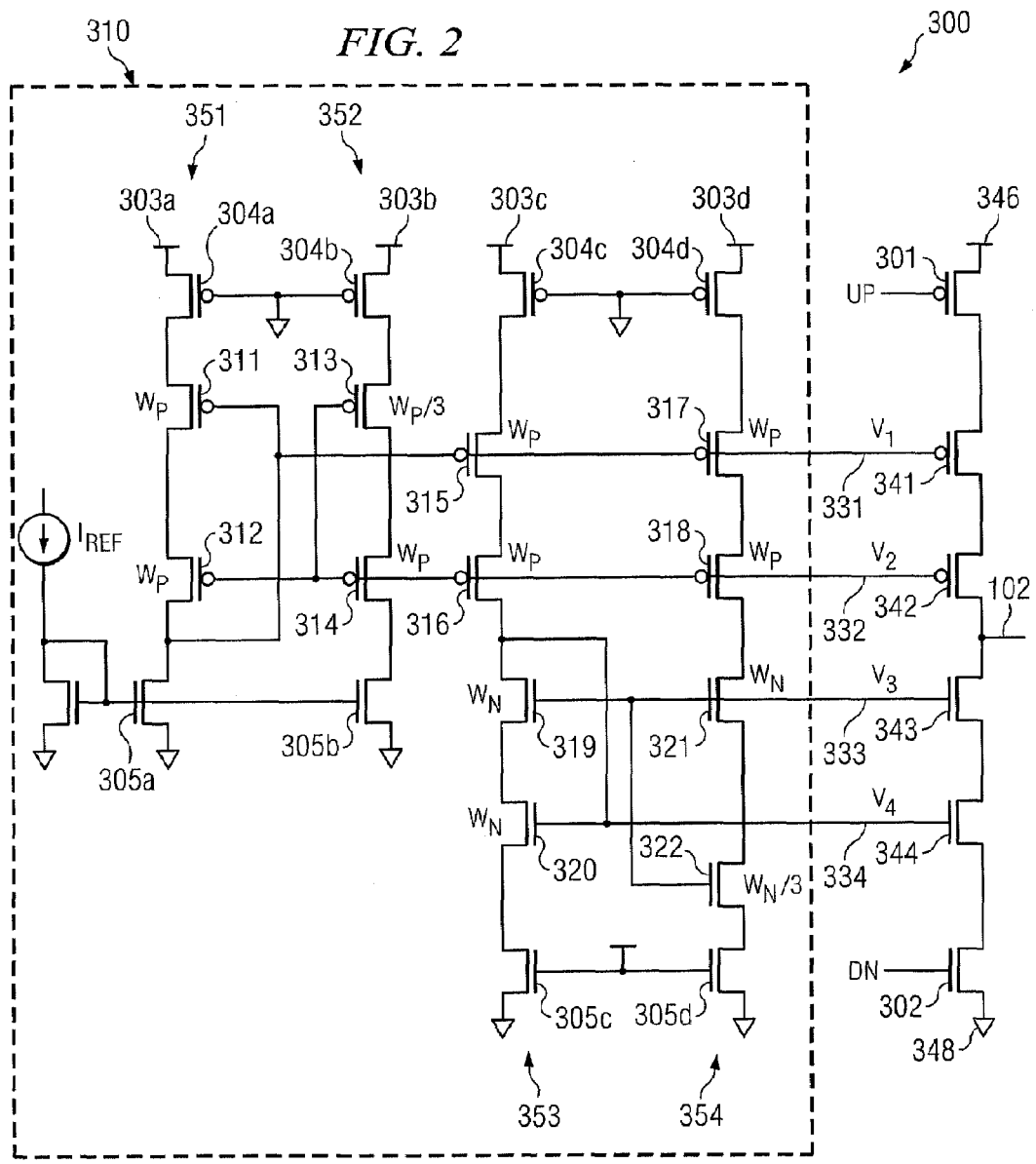
FIG. 2 illustrates a charge pump according to an example embodiment of the present disclosure.

FIG. 2 illustrates an example embodiment of charge pump 300. Charge pump 300 includes input transistors 301 and 302, cascode transistors 341-344, and a current mirror 310. Charge pump 300 may receive UP and DN error correction signals through input transistors 301 and 302, and may output a current, $I_{CP}$, corresponding to the error correction signals at node 102 (e.g., an UP signal may result in positive $I_{CP}$ and a DN signal may result in negative $I_{CP}$). Current mirror 310 may supply bias voltages to cascode transistors 341-344 which allow cascode transistors 341-344 to operate in saturation regime over the maximum swing of the output voltage of charge pump 300. When cascode transistors 341-344 operate in saturation, $I_{CP}$ does not depend (to the first approximation) on the output voltage at loop filter 400 ($V_{CTL}$). Consequently, when cascode transistors 341-344 operate in saturation, the properties of the subsequent loop filter 400 (e.g., the transfer function) remain undisturbed by charge pump 300.

In particular embodiments, the topology and selection of components in current mirror 310 enables current mirror 310 to produce a number of bias voltages $V_1$-$V_4$ that bias cascode transistors 341-344 at a point that maximizes the range of output voltages for which the charge pump 300 may operate as a current source in the regime of a large output resistance. As an example and not by way of limitation, current mirror 310 may include a plurality of p-type metal-oxide-semiconductor (pMOS) field-effect transistors and a plurality of n-type metal-oxide-semiconductor (nMOS) field-effect transistors. The transistors in current mirror 310 may be sized (e.g., the respective channel-widths of the transistors may be sized) so that the currents in the branches of current mirror 310 are equal and the bias voltages $V_1$-$V_4$ are set to values which enable cascode transistors 341-344 to operate in saturation regime over the maximum swing of the output voltage (as describe in further detail below).

Each one of cascode transistors 341-344 may be any transistor capable of being used to create a cascode structure in a charge pump. In the pictured embodiment, cascode transistors 341 and 342 are pMOS transistors positioned between input transistor 301 and node 102, and cascode transistors 343 and 344 are nMOS transistors positioned between input transistor 302 and node 102. Additionally, the source terminal of input transistor 301 is connected to a positive power supply 346 while the source terminal of input transistor 302 is connected to a negative power supply 348 (e.g., ground). In particular embodiments, cascode transistors 341-344 could also be bipolar junction transistors (BJTs), or metal-oxide-semiconductor field-effect transistors (MOSFETs) or a combination of BJTs and MOSFETs.

Cascode transistors 341-344 enable charge pump 300 to achieve an output resistance that is approximately equal to $g_{mN}r_{oN}^2 \| g_{mP}r_{oP}^2$ (where $g_{mN}$ and $r_{oN}$ represent the transconductance and output resistance of cascode transistors 341 and 342, and $g_{mP}$ and $r_{oP}$ represent the transconductance and output resistance of cascode transistors 343 and 344) for output voltages ($V_{CTL}$) in the range $V_{CTL} \epsilon [2V_{OVN}, V_{DD} - 2|V_{OVP}|]$ (as discussed below). In particular embodiments, $g_{mN}r_{oN}^2 \| g_{mP}r_{oP}^2$ may otherwise be expressed as $g_{mN}r_{oN}^2 * g_{mP}r_{oP}^2 / (g_{mN}r_{oN}^2 + g_{mP}r_{oP}^2)$ One of ordinary skill in the art will appreciate that the type of cascode transistors contained in charge pump 300 has been described for the purpose of explanatory simplicity and will further appreciate that the present disclosure contemplates using any suitable type of cascode transistors in conjunction with current mirror 310 in order to create a cascode structure in charge pump 300.

Current mirror 310 includes a plurality of pMOS transistors 311-318 and a plurality of nMOS transistors 319-322, operable in conjunction with other components of current mirror 310 (e.g., power supplies 303a-303d, pMOS replica transistors 304a-304d, and nMOS replica transistors 305a-305d) to supply bias voltages $V_1$-$V_4$ to cascode transistors 341-344. In particular embodiments, pMOS transistors 311-318 may produce bias voltages $V_1$ and $V_2$, respectively distributed on nodes 331 and 332. Additionally, nMOS transistors 319-322 may produce bias voltages $V_3$ and $V_4$ respectively distributed on nodes 333 and 334. Nodes 331-334, in turn, deliver bias voltages $V_1$-$V_4$ to the gate terminals of cascode transistors 341-344.

In particular embodiments, the pMOS replica transistors 304a-304d mimic the characteristics of input transistor 301 and the nMOS replica transistors 305a-305d mimic the characteristics of input transistor 302. For example, pMOS replica transistors 304a-304d have the same or substantially the same channel-width as input transistor 301, and pMOS replica transistors 304a-304d have the same or substantially the same channel-width as input transistor 302. Such sizing of the replica transistors 304a-304d and 350a-305d may facilitate equal current flow in each of the branches of current mirror 310. Additionally, the respective channel-widths ($W_p$) of pMOS transistors 311, 312, 314, and 315-318 are identical or substantially identical to one another while pMOS transistor 313 has a channel-width one-third the size of pMOS transistors 311, 312, 314, and 315-318 (e.g., $W_p/3$). Similarly, the respective channel-widths ($W_N$) of nMOS transistors 319-321 are identical or substantially identical to one another while nMOS transistor 322 has a channel width one-third the size of nMOS transistors 319-321 (e.g., $W_N/3$). Such sizing of transistors 311-322 enables currents of equal magnitude to flow along the branches of current mirror 310 and enables current mirror 310 to generate bias voltages V1-V4 in accordance with the following voltage equations:

$$V_1 = V_{DD} - |V_{THP} + V_{OVP}|$$

$$V_2 = V_{DD} - |V_{THP} + 2V_{OVP}|$$

$$V_3 = V_{THN} + 2V_{OVN}$$

$$V_4 = V_{THN} + V_{OVN}$$

In the above-described equations, $V_{DD}$ represents the voltage of a power supply 346, $V_{THP}$ represents a threshold voltage of the pMOS transistors 311-314 (e.g. a first order approximation of the threshold voltage of transistor 312), and $V_{THN}$ represents the threshold voltages of the nMOS transistors 319-322 (e.g. a first order approximation of the threshold voltage of transistor 319). $V_{OVP}$ represents the gate-to-source overdrive voltages of the pMOS transistors included in current mirror 310 (e.g., pMOS transistors 311-318) and $V_{OVN}$ represents the gate-to-source overdrive voltages of the nMOS transistors included in current mirror 310 (e.g., nMOS transistors 319-322). In particular embodiments, the voltage drop on input transistors 301 and 302 may be considered negligible with respect to $V_{OVN}$ and $V_{OVP}$, and hence, need not be included in calculation of the overdrive voltages. Additionally, $V_{THP}$ and $V_{OVP}$ are assumed to be negative. When transistors 311-322 are sized such that the above-described voltage equations are satisfied and equal currents are allowed to flow along the branches of current mirror 310, charge pump 300 may maintain linear operation over the voltage range $V_{CTL} \epsilon [2V_{OVN}, V_{DD} - |2V_{OVP}|]$. The above-described equations minimize V2 and maximize V3 such that the swing of charge pump 300 is maximized accordingly.

Current mirror 310 may be co-located with cascode transistors 341-344 on the same chip. By using current mirror 310 to locally provide bias voltages $V_1$-$V_4$, charge pump 300 may track dynamic variations in process, voltage, and temperature ("PVT"). As an example and not by way of limitation, the particular values of bias voltages $V_1$-$V_4$ may change in accordance with different process corners, supply voltages, and operating temperatures (e.g., different PVT points) to reflect the voltage values needed to pass the required amount of current ($I_{CP}$) through charge pump 300. By adjusting the "bottom" bias voltages (e.g., V1 and V4) and the "top" bias voltages (e.g., $V_2$ and $V_3$) in accordance with the above-described equations, current mirror 310 may maximize the swing of the output voltage ($V_{CTL}$) for each particular PVT point, and thereby, may automatically maximize the range of frequencies for which system 100 operates properly (e.g., properly tracks the phase of an input signal).

In particular embodiments, the drain voltage of the top pMOS transistor in current mirror 310 (e.g., transistor 311) is mirrored with the drain voltage of cascode transistor 341. Likewise, the drain voltage of the bottom pMOS transistor in current mirror 310 (e.g., transistor 320) is mirrored with the drain voltage of cascode transistor 344. By mirroring the drain voltage of transistor 311 with that of cascode transistor 341 and the drain voltage of transistor 320 with that of cascode transistor 344, charge pump 300 may reduce or eliminate the differences between the currents in the branches of current mirror 310 attributable to dissimilar drain-to-source voltages of transistor 311 and cascode transistor 341 and of transistor 320 and cascode transistor 344. For example, when the drain voltage of transistor 311 is mirrored with that of cascode transistor 341, the current in branches 351 and 352 is identical or substantially identical to the current flowing from positive power supply 346 to output node 102 (i.e., the branch including cascode transistors 341 and 342). Likewise, when the drain voltage of transistor 320 is mirrored with that of cascode transistor 344, the current in branches 353 and 354 is identical or substantially identical to the current flowing from negative power supply 348 (e.g., ground) to output node 102 (i.e., the branch including cascode transistors 343 and 344). By reducing or eliminating the differences between the currents in the branches of current mirror 310 as described above, the systematic gain error of charge pump 300 may be diminished or eliminated.

In particular embodiments, the large output resistance of charge pump 300, the linear range of operation of charge pump 300, the relatively low systematic gain error of charge pump 300, or a combination thereof, may allow system 100 to operate using a relatively small charge pump current and low supply voltage. As an example and not by way of limitation, particular embodiments of charge pump 300 may be used in PLLs and Clock Data Recovery (CDR) circuits that employ on-chip loop filters. In particular embodiments, charge pump 300 may be designed for use in deep submicron Complimentary Metal-Oxide-Semiconductor (CMOS) processes which have exhibited scaling trends towards lower output resistance of the transistors and lower supply voltages.

The present disclosure encompasses all changes, substitutions, variations, alterations, and modifications to the example embodiments described herein that a person having ordinary skill in the art would comprehend. Similarly, where appropriate, the appended claims encompass all changes, substitutions, variations, alterations, and modifications to the example embodiments described herein that a person having ordinary skill in the art would comprehend. Moreover, although particular components of FIG. 1 are described and illustrated as executing particular steps in the present disclosure, the present disclosure contemplates any suitable components executing any suitable steps.

What is claimed is:

1. A charge pump comprising:
   a first input transistor operable to:
      receive an up ("UP") signal;
      in response to receiving the UP signal, transmit a corresponding output current from a positive power supply to an output node;
   a second input transistor operable to:
      receive a down ("DN") signal;
      in response to receiving the DN signal, transmit the corresponding output current from a negative power supply to the output node;
   a first cascode transistor and a second cascode transistor positioned in a first current path between the first input transistor and the output node;
   a third cascode transistor and a fourth cascode transistor positioned in a second current path between the second input transistor and the output node;
   a current mirror coupled to gates of the first, second, third, and fourth cascode transistors and operable to transmit a first bias voltage (V1), a second bias voltage (V2), a third bias voltage (V3), and a fourth bias voltage (V4) to the gates of the first, second, third, and fourth cascode transistors, wherein:
      the current mirror comprises a plurality of p-type metal-oxide-semiconductor (pMOS) field-effect transistors and a plurality of n-type metal-oxide-semiconductor (nMOS) field-effect transistors, each pMOS or nMOS transistor comprising a channel-width;
      the respective channel-widths of the pMOS and nMOS transistors determine values of the bias voltages V1-V4;
      the bias voltages V1-V4 respectively enable the first, second, third, and fourth cascode transistors to operate in a saturation region; and
      the plurality of pMOS transistors each have an equal channel-width (Wp);
      the plurality of nMOS transistors each have an equal channel-width (WN); and further comprising:
         one pMOS transistor having a channel-width of Wp/3; and
         one nMOS transistor having a channel-width of WN/3.

2. The charge pump of claim 1, wherein:
   the plurality of pMOS transistors and the plurality of nMOS transistors are configured to produce bias voltages V1-V4 according to the following equations:

$V1 = VDD - |VTHP + VOVP|;$ $V2 = VDD - |VTHP + 2VOVP|;$ $V3 = VTHN + 2VOVN$ $V4 = VTHN + VOVN;$ and wherein VDD represents the voltage of the positive power supply, VTHP represents the threshold voltages of the plurality of pMOS transistors in the current mirror, VTHN represents the threshold voltages of the plurality of nMOS transistors in the current mirror, VOVP represents the gate-to-source overdrive voltages of the plurality of pMOS transistors in the current mirror, and VOVN represents the gate-to-source overdrive voltages of the plurality of nMOS transistors included in current mirror.

3. The charge pump of claim 1, wherein:
   a source terminal of the first cascode transistor is connected to a drain terminal of the first input transistor;
   a source terminal of the fourth cascode transistor is connected to a drain terminal of the second input transistor; and
   the current mirror is configured to mirror a voltage on the drain terminal of the first cascode transistor and a voltage on the drain terminal of the fourth cascode transistor.

4. The charge pump of claim 1, wherein:
   the first and second cascode transistors comprise pMOS transistors;
   the third and fourth cascode transistors comprise nMOS transistors;
   the first cascode transistor is configured to operate in the saturation region when bias voltage V1 is applied to its gate;
   the second cascode transistor is configured to operate in the saturation region when bias voltage V2 is applied to its gate;
   the third cascode transistor is configured to operate in the saturation region when bias voltage V3 is applied to its gate; and
   the fourth cascode transistor is configured to operate in the saturation region when bias voltage V4 is applied to its gate.

5. The charge pump of claim 1, further comprising:
   a plurality of pMOS replica transistors each having a channel-width that is the same or substantially the same to a first channel-width of the first input transistor;
   a plurality of nMOS replica transistors each having a channel-width that is the same or substantially the same to a second channel-width of the second input transistor.

6. The charge pump of claim 1, wherein:
   the current mirror transmits bias voltages V1-V4 to the gates of the first, second, third, and fourth cascode transistors over a first node, a second node, a third node, and a fourth node;
   the plurality of pMOS transistors and the plurality of nMOS transistors are configured to transmit currents along each of a plurality of branches in the current mirror;

the corresponding output current from the positive power supply to the output node is equal in magnitude to the currents in each of the plurality of branches in the current mirror.

7. The charge pump of claim 1, wherein the current mirror:
resides locally on a microchip with the cascode transistors; and
is operable to adjust the bias voltages V1-V4 to compensate for changes in process corners, supply voltages, and operating temperatures.

8. The charge pump of claim 1, wherein the cascode transistors are configured to produce an output resistance at the output node equal to gmNroN2|gmProP2 for a range of output voltages (VCTL) in the set VCTL [2VOVN, VDD−|2VOVP|] where gmP and roP represent the transconductance and output resistance of the first and second cascode transistors and gmN and roN represent the transconductance and output resistance of the third and fourth cascode transistors VDD represents the voltage of the positive power supply, VTHP represents the threshold voltages of the plurality of pMOS transistors in the current mirror, VOVP represents the gate-to-source overdrive voltages of the plurality of pMOS transistors in the current mirror, and VOVN represents the gate-to-source overdrive voltages of the plurality of nMOS transistors included in current mirror.

9. A charge pump comprising:
a first input transistor operable to:
receive an up ("UP") signal;
in response to receiving the UP signal, transmit a corresponding output current from a positive power supply to an output node;
a second input transistor operable to:
receive a down ("DN") signal;
in response to receiving the DN signal, transmit the corresponding output current from a negative power supply to the output node;
a first cascode transistor and a second cascode transistor positioned in a first current path between the first input transistor and the output node;
a third cascode transistor and a fourth cascode transistor positioned in a second current path between the second input transistor and the output node;
a current mirror coupled to gates of the first, second, third, and fourth cascode transistors, the current mirror comprising:
a plurality of pMOS transistors each having an equal channel-width (Wp);
one pMOS transistor having a channel-width of Wp/3;
a plurality of nMOS transistors each having an equal channel-width (WN);
one nMOS transistor having a channel-width of WN/3; and wherein:
the current mirror is configured to respectively transmit a first bias voltage (V1), a second bias voltage (V2), a third bias voltage (V3), and a fourth bias voltage (V4) to the gates of the first, second, third, and fourth cascode transistors.

10. The charge pump of claim 9, wherein:
a source terminal of the first cascode transistor is connected to a drain terminal of the first input transistor;
a source terminal of the fourth cascode transistor is connected to a drain terminal of the second input transistor; and
the current mirror is configured to mirror a voltage on the drain terminal of the first cascode transistor and a voltage on the drain terminal of the fourth cascode transistor.

11. The charge pump of claim 9, wherein:
the first cascode transistor is configured to operate in the saturation region when bias voltage V1 is applied to its gate;
the second cascode transistor is configured to operate in the saturation region when bias voltage V2 is applied to its gate;
the third cascode transistor is configured to operate in the saturation region when bias voltage V3 is applied to its gate; and
the fourth cascode transistor is configured to operate in the saturation region when bias voltage V4 is applied to its gate.

12. The charge pump of claim 9, wherein:
the current mirror is operable to supply bias voltages V1-V4 to the gates of the first, second, third, and fourth cascode transistors over a first node, a second node, a third node, and a fourth node; and
the plurality of pMOS transistors and the plurality of nMOS transistors are configured to transmit currents along each of a plurality of branches in the current mirror;
the corresponding output current from the positive power supply to the output node is equal in magnitude to the currents in each of the plurality of branches in the current mirror.

13. The charge pump of claim 9, wherein the current mirror:
resides locally on a microchip with the cascode transistors; and
is operable to adjust the bias voltages V1-V4 to compensate for changes in process corners, supply voltages, and operating temperatures.

14. The charge pump of claim 9, wherein:
the cascode transistors are configured to produce an output resistance at the output node equal to gmNroN2||gmProP2 for a range of output voltages (VCTL) in the set VCTL [2VOVN, VDD−|2VOVP|];
gmP and roP represent the transconductance and output resistance of the first and second cascode transistors and gmN and roN represent the transconductance and output resistance of the third and fourth cascode transistors; and
VDD represents the voltage of the positive power supply, VTHP represents the threshold voltages of the plurality of pMOS transistors in the current mirror, VOVP represents the gate-to-source overdrive voltages of the plurality of pMOS transistors in the current mirror, and VOVN represents the gate-to-source overdrive voltages of the plurality of nMOS transistors included in current mirror.

15. A charge pump comprising:
a first input transistor operable to:
receive an up ("UP") signal;
in response to receiving the UP signal, transmit a corresponding output current from a positive power supply to an output node;
a second input transistor operable to:
receive a down ("DN") signal;
in response to receiving the DN signal, transmit the corresponding output current from a negative power supply to the output node;
a first cascode transistor and a second cascode transistor positioned in a first current path between the first input transistor and the output node;
a third cascode transistor and a fourth cascode transistor positioned in a second current path between the second input transistor and the output node;

a current mirror coupled to gates of the first, second, third, and fourth cascode transistors, the current mirror comprising:
- a plurality of pMOS transistors each having an equal channel-width (Wp);
- one pMOS transistor having a channel-width of Wp/3;
- a plurality of nMOS transistors each having an equal channel-width (WN);
- one nMOS transistor having a channel-width of WN/3; and, wherein:
  - the respective channel-widths of the pMOS and nMOS transistors determine values of the bias voltages V1-V4;
  - the bias voltages V1-V4 respectively enable the first, second, third, and fourth cascode transistors to operate in a saturation region;
  - the pMOS transistors and the nMOS transistors are configured to produce the bias voltages V1-V4 according to the following equations:

$$V1 = VDD - |VTHP + VOVP|;$$

$$V2 = VDD - |VTHP + 2VOVP|;$$

$$V3 = VTHN + 2VOVN;$$

$$V4 = VTHN + VOVN;\text{ and wherein:}$$

VDD represents the voltage of the positive power supply, VTHP represents the threshold voltages of the plurality of pMOS transistors in the current mirror, VTHN represents the threshold voltages of the plurality of nMOS transistors in the current mirror, VOVP represents the gate-to-source overdrive voltages of the plurality of pMOS transistors in the current mirror, and VOVN represents the gate-to-source overdrive voltages of the plurality of nMOS transistors included in current mirror.

16. The charge pump of claim 15, wherein the cascode transistors are configured to produce an output resistance at the output node equal to gmNroN2||gmProP2 for a range of output voltages (VCTL) in the set VCTL [2VOVN, VDD−|2VOVP|] wherein where gmP and roP represent the transconductance and output resistance of the first and second cascode transistors and gmN and roN represent the transconductance and output resistance of the third and fourth cascode transistors.

17. The charge pump of claim 15, wherein:
- the current mirror is operable to supply bias voltages V1-V4 to the gates of the first, second, third, and fourth cascode transistors over a first node, a second node, a third node, and a fourth node;
- the plurality of pMOS transistors and the plurality of nMOS transistors are configured to transmit currents along each of a plurality of branches in the current mirror; and
- the corresponding output current from the positive power supply to the output node is equal in magnitude to the currents in each of the plurality of branches in the current mirror.

18. The charge pump of claim 15, wherein the current mirror:
- resides locally on a microchip with the cascode transistors; and
- is operable to adjust the bias voltages V1-V4 to compensate for changes in process corners, supply voltages, and operating temperatures.

19. The charge pump of claim 15, wherein:
- the first and second cascode transistors comprise pMOS transistors;
- the third and fourth cascode transistors comprise nMOS transistors;
- a source terminal of the first cascode transistor is connected to a drain terminal of the first input transistor;
- a source terminal of the fourth cascode transistor is connected to a drain terminal of the second input transistor; and
- the current mirror is configured to mirror a voltage on the drain terminal of the first cascode transistor and a voltage on the drain terminal of the fourth cascode transistor.

* * * * *

UNITED STATES PATENT AND TRADEMARK OFFICE
CERTIFICATE OF CORRECTION

PATENT NO. : 7,688,122 B2
APPLICATION NO. : 11/970288
DATED : March 30, 2010
INVENTOR(S) : Nedovic It is certified that error appears in the above-identified patent and that said Letters Patent is hereby corrected as shown below:

In the Claims

Column 9, Line 19, Claim 18 after "casecode transistors" please insert -- ; and --.

Signed and Sealed this
Twenty-sixth Day of November, 2013

Margaret A. Focarino
*Commissioner for Patents of the United States Patent and Trademark Office*